(12) United States Patent
Koda (10) Patent No.: US 7,164,700 B2
(45) Date of Patent: Jan. 16, 2007

(54) LASER DRIVING CIRCUIT

(75) Inventor: Akeshi Koda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 228 days.

(21) Appl. No.: 11/028,529

(22) Filed: Jan. 5, 2005

(65) Prior Publication Data

US 2005/0207460 A1    Sep. 22, 2005

(30) Foreign Application Priority Data

Mar. 16, 2004  (JP) .............................. 2004-075212

(51) Int. Cl.
*H01S 3/00* (2006.01)
(52) U.S. Cl. ................. 372/38.02; 372/38.07; 372/38.09
(58) Field of Classification Search ............. 372/38.02, 372/38.07, 38.09
See application file for complete search history.

(56) References Cited

U.S. PATENT DOCUMENTS 5,563,898 A * 10/1996 Ikeuchi et al. ........... 372/38.07
6,636,472 B1    10/2003 Kurebayashi et al.
6,711,189 B1 *  3/2004 Gilliland et al. ......... 372/38.02

FOREIGN PATENT DOCUMENTS

JP          61-289543        12/1986

* cited by examiner

*Primary Examiner*—Armando Rodriguez
(74) *Attorney, Agent, or Firm*—McDermott Will & Emery LLP (57) ABSTRACT

There is provided a laser driving circuit having a small circuit scale which is capable of low voltage operation and in which unnecessary writing in an optical disc, or the like, is entirely prevented. To this end, the laser driving circuit includes a source-grounded amplifier to which the supply voltage of the first power supply is supplied as well as to a laser driving circuit block and to which the voltage of the second power supply of a control circuit block is input. A bias input terminal of a differential amplifier is pulled up according to an output of the source-grounded amplifier till the voltage of the second power supply rises, whereby an output of the laser driving circuit block is suppressed. With such a structure, unnecessary emission of a semiconductor laser, breakage of the semiconductor laser, etc., are prevented.

12 Claims, 5 Drawing Sheets

LASER DRIVING CIRCUIT

CROSS-REFERENCE TO RELATED APPLICATION

This Nonprovisional application claims priority under 35 U.S.C. §119 (a) on patent application No. 2004-075212 filed in Japan on Mar. 16, 2004, the entire contents of which are hereby incorporated by reference.

BACKGROUND OF THE INVENTION

1. Field of the Invention

The present invention relates to a semiconductor laser driving circuit used in an optical disc drive, or the like, and specifically to the technique of controlling emission of a semiconductor laser at the time of power-on where the supply voltage is unstable.

2. Description of the Prior Art

An optical disc drive includes a driving circuit for driving a semiconductor laser and an emission control circuit for controlling the emission intensity of the semiconductor laser, or the like. These circuits require power supplies of different voltage levels in many cases. Since the emission control circuit is generally realized by a digital circuit, the supply voltage of the emission control circuit is lower than the supply voltage of the semiconductor laser driving circuit.

When the optical disc drive is powered on, if the semiconductor laser driving circuit is powered on earlier than the emission control circuit, the semiconductor laser driving circuit operates to allow a semiconductor laser to emit light before the emission control circuit enters the normal operation state, resulting in some undesirable problems, such as unnecessary writing in an optical disc, breakage of the semiconductor laser, or the like.

In a conventional laser driving circuit, a Zener diode and a comparator capable of operating at a voltage lower than that of the above emission control circuit are used to construct a circuit for comparing the supply voltage of the emission control circuit with a reference voltage. The logic level of a control signal of the emission control circuit is set such that the semiconductor laser does not emit light when the supply voltage of the emission control circuit is equal to or lower than the reference voltage, whereby the above problems are prevented (see, for example, Japanese Unexamined Patent Publication No. 61-289543 (FIG. 1)).

In a laser driving circuit realized by one chip, if a Zener diode is used for obtaining a reference voltage as in the above conventional technique, it is necessary to fabricate a circuit through a bipolar process, and therefore, it is difficult to realize the laser driving circuit in the form of a MOS device. This means that it is difficult to achieve a low-voltage circuit.

Further, the circuit scale is large because a comparator is used for comparing the supply voltage of the emission control circuit with the reference voltage.

Furthermore, the supply voltage of the emission control circuit cannot be compared with the reference voltage before the supply voltage of the emission control circuit reaches a voltage level at which the comparator can operate. Thus, the above technique does not necessarily entirely prevent the above problems, such as unnecessary writing in an optical disc, etc.

SUMMARY OF THE INVENTION

The present invention was conceived in view of the above problems. An objective of the present invention is to provide a laser driving circuit having a small circuit scale which is capable of low voltage operation and in which unnecessary writing in an optical disc, or the like, is entirely prevented.

In order to achieve the above objective, the present invention provides a laser driving circuit for driving a semiconductor laser, comprising: a driving signal output circuit for outputting a driving signal according to a control signal output from a control circuit, the driving signal output circuit being supplied with a voltage of a first power supply, the control circuit being supplied with a voltage of a second power supply, the control signal being used for driving the semiconductor laser; a source-grounded amplifier which is supplied with the voltage of the first power supply, the voltage of the second power supply being input to the source-grounded amplifier as an input signal; and drive suppression means for stopping the driving signal output circuit from driving the semiconductor laser according to an output of the source-grounded amplifier if the voltage of the second power supply is lower than a predetermined voltage.

With the above structure, the operation of the semiconductor laser is stopped till the supply voltage supplied to the control circuit rises to a voltage at which appropriate control is performed, whereby unnecessary emission, breakage of the semiconductor laser, etc., are entirely prevented.

One embodiment of the present invention is the aforementioned laser driving circuit wherein the source-grounded amplifier includes: a transistor having a grounded source terminal and a gate terminal to which the voltage of the second power supply is input; and a resistor provided between a drain terminal of the transistor and the first power supply.

One embodiment of the present invention is the aforementioned laser driving circuit wherein the source-grounded amplifier includes: a first transistor having a grounded source terminal and a gate terminal to which the voltage of the second power supply is input; and a second transistor having a source terminal which is connected to a drain terminal of the first transistor and drain and gate terminals which are connected to the first power supply.

One embodiment of the present invention is the aforementioned laser driving circuit wherein the source-grounded amplifier includes: a transistor having a grounded source terminal and a gate terminal to which the voltage of the second power supply is input; and a constant-current circuit provided between a drain terminal of the transistor and the first power supply.

One embodiment of the present invention is the aforementioned laser driving circuit further comprising a current mirror circuit for generating a predetermined constant current wherein the constant-current circuit is a transistor having a gate terminal to which a control voltage of the current mirror circuit is input.

With the above features, drive control is performed according to the supply voltage supplied to the above-described control circuit even with a significantly small circuit scale.

One embodiment of the present invention is the aforementioned laser driving circuit wherein: the driving signal output circuit includes an amplifier whose operation is activated/deactivated by an operation control signal; and if the voltage of the second power supply is lower than the predetermined voltage, the drive suppression means outputs the operation control signal such that the operation of the amplifier is stopped.

One embodiment of the present invention is the aforementioned laser driving circuit wherein the drive suppression means includes a transistor which sets the driving signal to a predetermined drive stop voltage if the voltage of the second power supply is lower than the predetermined voltage.

One embodiment of the present invention is the aforementioned laser driving circuit wherein the predetermined drive stop voltage is the voltage of the first power supply or a ground voltage.

One embodiment of the present invention is the aforementioned laser driving circuit wherein the driving signal output circuit includes: an amplifier; a constant-current circuit; and a transistor which is supplied with a bias current from the constant-current circuit and amplifies an output signal of the amplifier to output the driving signal.

One embodiment of the present invention is the aforementioned laser driving circuit wherein the drive suppression means includes a transistor which interrupts the driving signal if the voltage of the second power supply is lower than the predetermined voltage.

With the above features, if the supply voltage supplied to the control circuit is low, the operation of the semiconductor laser is surely stopped.

One embodiment of the present invention is the aforementioned laser driving circuit wherein if the voltage of the second power supply is lower than the predetermined voltage or if the control circuit outputs a drive stop signal, the drive suppression means stops the driving signal output circuit from driving the semiconductor laser.

One embodiment of the present invention is the aforementioned laser driving circuit wherein: the driving signal output circuit further includes an amplifier whose operation stops when a drive stop signal is output from the control circuit; and if the voltage of the second power supply is lower than the predetermined voltage or if the control circuit outputs the drive stop signal, the drive suppression means stops the driving signal output circuit from driving the semiconductor laser.

With the above features, control is performed according to the supply voltage supplied to the above-described control circuit and, meanwhile, the drive stop control is performed by the control circuit.

DESCRIPTION OF THE PREFERRED EMBODIMENTS

Hereinafter, embodiments of the present invention are described with reference to the drawings.

(Embodiment 1)

Figure 1:
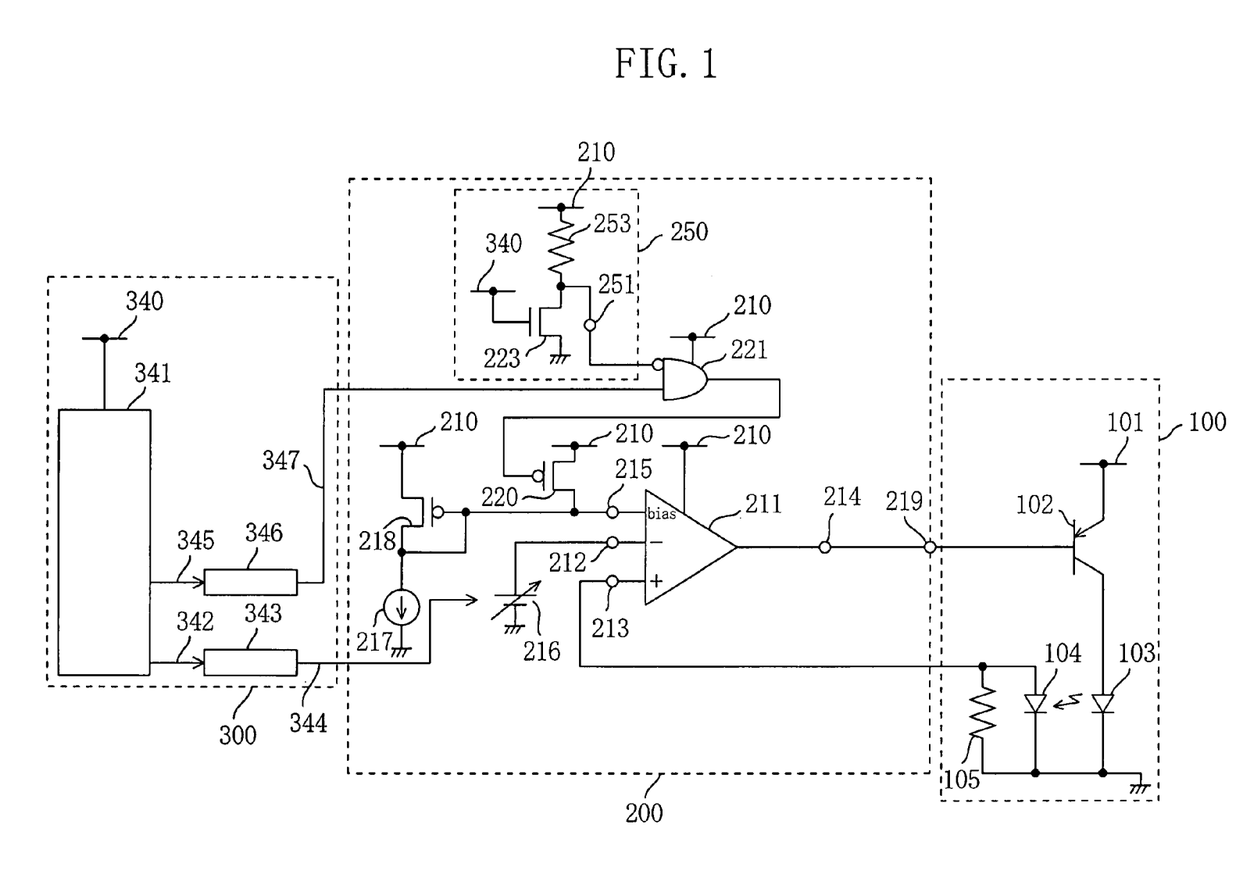
FIG. 1 is a circuit diagram showing a structure of a laser driving circuit according to embodiment 1 of the present invention.

FIG. 1 is a circuit diagram showing a structure of a laser driving circuit according to embodiment 1 of the present invention. The laser driving circuit of embodiment 1 is exclusively used for a reading operation. The laser driving circuit includes a laser driving circuit block 200 and a control circuit block 300 and is connected to an optical pickup 100. The laser driving circuit block 200, the control circuit block 300 and the optical pickup 100 are supplied with different supply voltages from a first power supply 210, a second power supply 340 and a third power supply 101, respectively.

The optical pickup 100 irradiates an optical disc with semiconductor laser light and converts the light reflected by the disc to an electric signal. The optical pickup 100 includes a semiconductor laser 103, a transistor 102 for driving the semiconductor laser 103 (hereinafter, "semiconductor laser driving transistor 102"), a light receiving element 104, and a resistor 105.

The laser driving circuit block 200 drives the optical pickup 100 according to a control signal 344 (described later) from the control circuit block 300, or the like, such that the semiconductor laser emits light at a predetermined intensity or stops emission of the light.

The laser driving circuit block 200 includes a source-grounded amplifier 250 which will be described later in detail, an AND circuit 221, one of the inputs of which is a NOT circuit, a transistor 220 for power down (hereinafter, "power down transistor 220"), a differential amplifier 211, a variable reference power supply 216 which is formed by, for example, a D/A converter, a constant-current source 217, a transistor 218 and an output terminal 219.

The output voltage of the light receiving element 104 is connected to a non-inverted input terminal 213 of the differential amplifier 211. The variable reference power supply 216 is connected to an inverted input terminal 212 of the differential amplifier 211. An output terminal 214 is connected to a base terminal of the semiconductor laser driving transistor 102 through the output terminal 219. The constant-current source 217 and gate and drain terminals of the transistor 218 are connected to a bias input terminal 215 of the differential amplifier 211. The transistor 218 is a transistor provided at a copy side of a current mirror circuit with respect to the constant-current source 217. The transistor 218 is connected to a mirror-side transistor provided in the differential amplifier 211 such that a predetermined bias current is supplied to the differential amplifier 211.

The power down transistor 220 is used for a so-called power down operation, i.e., used for putting the differential amplifier 211 into a standby state when none of reproduction and recording on an optical disc is performed, for example.

The source-grounded amplifier 250 includes an N-channel transistor 223 and a resistor 253. The N-channel transistor 223 has a gate terminal which is connected to the second power supply 340 and a source terminal which is grounded. The resistor 253 is connected between the first power supply 210 and the drain terminal of the N-channel transistor 223. The voltage at the drain terminal is output from an output terminal 251 as a signal voltage which is determined according to the voltage of the second power supply 340 connected to the gate terminal.

The output terminal 251 is connected to a NOT input terminal of the AND circuit 221. A control signal 347 which will be described later is connected to the other terminal of the AND circuit 221. The output terminal of the AND circuit 221 is connected to the gate terminal of the power down transistor 220. The power down transistor 220 performs the power-down operation according to the output signal of the AND circuit 221.

The control circuit block 300 outputs the control signal (data signal) 344 which is used for setting the voltage value of the variable reference voltage and the control signal 347 which is used for controlling the power-down operation of the differential amplifier 211 of the laser driving circuit block 200.

Specifically, the control circuit block 300 includes a control circuit 341, a level shift circuit 343 and a level shift circuit 346.

The control circuit 341 output a control signal 342 which is used for setting the voltage value of the variable reference voltage and a control signal 345 which is used for controlling the power down operation. These control signals are converted by the level shift circuits 343 and 346, respectively, to have the voltage levels of the first power supply 210 used for a laser driving circuit and output as the control signals 344 and 347, respectively.

Now, an operation of the laser driving circuit having the above-described structure is described.

(Operation Performed when the Supply Voltage is in a Stationary State)

In the first place, a normal control operation, which is performed after a sufficient time has passed since power-on and the power supply has become stable, is described for convenience of illustration.

The control circuit 341 outputs the control signal 342 which is determined according to a target value of the emission intensity of the semiconductor laser 103. The voltage level of the control signal 342 is shifted by the level shift circuit 343, and a resultant signal is input to the variable reference power supply 216 as the control signal 344. The variable reference power supply 216 generates a control voltage according to the control signal 344 and inputs the generated control signal to the inverted input terminal of the differential amplifier 211. In the meanwhile, the voltage generated at the light receiving element 104 according to an actual emission intensity of the semiconductor laser 103 is input to the non-inverted input terminal of the differential amplifier 211. The differential amplifier 211 outputs a voltage generated according to the difference between the voltages input to the inverted and non-inverted input terminals. The voltage output from the differential amplifier 211 is supplied to the base terminal of the semiconductor laser driving transistor 102 to control the electric current flowing into the semiconductor laser 103, while feedback control is performed such that the emission intensity of the semiconductor laser 103 is equal to the target value.

When the control signal 347 which is output from the level shift circuit 346 according to the control signal 345 output from the control circuit 341 falls to L (Low) level, the power down transistor 220 is turned ON, so that the voltage of the first power supply 210 is applied to the bias input terminal 215 of the differential amplifier 211. As a result, the differential amplifier 211 is put into a standby state, and emission of the semiconductor laser 103 is stopped.

(Operation at Power-on)

An operation performed till the supply voltage reaches a stationary state after power-on is described.

At power-on, the differential amplifier 211 and the semiconductor laser driving transistor 102 do not operate till the voltages of the first power supply 210 provided for the laser driving circuit block 200 and the third power supply 101 provided for the optical pickup 100 rise to a certain level. Thus, there is no possibility that an excessively-high voltage is applied to the semiconductor laser driving transistor 102 or the semiconductor laser 103 to cause damage to the semiconductor laser driving transistor 102 or abnormal emission of the semiconductor laser 103.

In the case where the voltage of the second power supply 340 provided for the control circuit block 300 has risen to a sufficient level before the voltage of the first power supply 210 or the third power supply 101 reaches a certain level, the control circuit block 300 controls the laser driving circuit block 200 such that the differential amplifier 211 normally operates. Therefore, in this case also, there is no possibility of causing damage to the semiconductor laser driving transistor 102 or abnormal emission of the semiconductor laser 103.

In the case where the voltage of the second power supply 340 provided for the control circuit block 300 has not risen to a sufficient level at the time when the voltage of the first power supply 210 or the third power supply 101 reaches a certain level, the operation described below is performed to prevent damage to the semiconductor laser driving transistor 102 and abnormal emission of the semiconductor laser 103.

When the voltage value of the second power supply 340 (Vdd0) is smaller than the threshold voltage of the N-channel transistor 223 (Vt0), i.e., when Vdd0<Vt0, the N-channel transistor 223 is OFF, and the voltage at the output terminal 251 is substantially equal to the voltage value of the first power supply 210 (Vdd1). When Vdd0 exceeds Vt0, the N-channel transistor 223 is turned ON. As Vdd0 rises, the voltage at the output terminal 251 of the source-grounded amplifier decreases substantially linearly toward 0 (zero). Thus, the output voltage at the output terminal 251 decreases from Vdd1 as the voltage of the second power supply 340, which is an input, increases.

Before the voltage of the second power supply 340 rises, the output of the AND circuit 221 is L level irrespective of the logical value of the control signal 347 which is input from the control circuit block 300, and the power down transistor 220 is ON. Accordingly, the voltage of the first power supply 210 is applied to the bias input terminal 215 of the differential amplifier 211, whereby the differential amplifier 211 is put into a standby state, and therefore, emission of the semiconductor laser 103 is not performed.

When the voltage value of the second power supply 340 rises to a sufficient level such that the voltage at the output terminal 251 of the source-grounded amplifier 250 is equal to or lower than a predetermined voltage level, the output signal of the AND circuit 221 is a signal having the same logical value as that of the control signal 347. Since the control signal 344 is input to the variable reference power supply 216, emission of the optical pickup 100 is appropriately controlled according to the control signals 347 and 344.

As described above, when the power supply for the laser driving block (the first power supply 210) is up whereas the power supply for the control circuit (the second power supply 340) is not up, the differential amplifier 211 is in a standby state. Thus, accidental emission of the semiconductor laser 103 and damage to the semiconductor laser 103 or the semiconductor laser driving transistor 102 are prevented.

Further, the principal part of the source-grounded amplifier is formed by a single transistor, and therefore, the entire source-grounded amplifier is realized by a small-scale circuit.

(Alternative Example of Embodiment 1)

Figure 2:
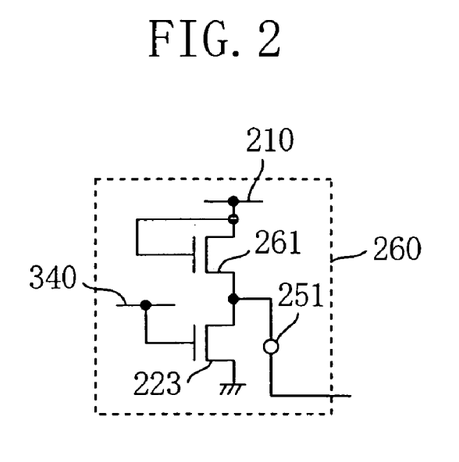
FIG. 2 is a circuit diagram showing a structure of a laser driving circuit according to an alternative example of embodiment 1 of the present invention.

A source-grounded amplifier 260 shown in FIG. 2 may be provided in place of the source-grounded amplifier 250 described above. It should be noted that, in the descriptions provided below, the components having the same function as those described in the above example of embodiment 1 are denoted by like reference numerals, and detailed descriptions thereof will be omitted.

The source-grounded amplifier 260 includes an N-channel transistor 223 and an N-channel transistor 261. As for the N-channel transistor 223, the gate terminal is connected to the second power supply 340 while the source terminal is grounded as in embodiment 1, whereby a source-grounded amplifier is constructed.

As for the N-channel transistor 261, the source terminal is connected to the drain terminal of the N-channel transistor 223, and the gate terminal and drain terminal are connected to the first power supply 210. The voltage at the connection point between the source terminal of the N-channel transistor 261 and the drain terminal of the N-channel transistor 223 is output from the output terminal 251.

In the source-grounded amplifier 260, when the voltage value of the second power supply 340 (Vdd0) is smaller than the threshold voltage of the N-channel transistor 223 (Vt0), i.e., when Vdd0<Vt0, the N-channel transistor 223 is OFF, and the voltage at the output terminal 251 is Vdd1−Vt1 where Vdd1 is the voltage value of the first power supply 210 and Vt1 is the threshold voltage of the N-channel transistor 261. When Vdd0 exceeds Vt0, the N-channel transistor 223 is turned ON. As Vdd0 rises, the voltage at the output terminal 251 of the source-grounded amplifier decreases substantially linearly toward 0 (zero). Thus, as in the source-grounded amplifier 250 of embodiment 1, the output voltage at the output terminal 251 decreases from the value of Vdd1−Vt1 as the voltage of the second power supply 340, which is input to the N-channel transistor 223, increases.

Also in this alternative example, when the power supply for the laser driving block (the first power supply 210) is up whereas the power supply for the control circuit (the second power supply 340) is not up, the differential amplifier 211 is in a standby state. Thus, accidental emission of the semiconductor laser 103 and damage to the semiconductor laser 103 and other elements are prevented.

This alternative example is less susceptible to a variation or change in the resistance value which may be caused due to a variation in production or temperature dependency as compared with the first example of embodiment 1 where the resistor 253 is connected between the drain terminal of the N-channel transistor 223 and the first power supply 210. Thus, the operation of the differential amplifier 211 is controlled with higher accuracy according to the voltage of the second power supply 340.

(Another Alternative Example of Embodiment 1)

Figure 3:
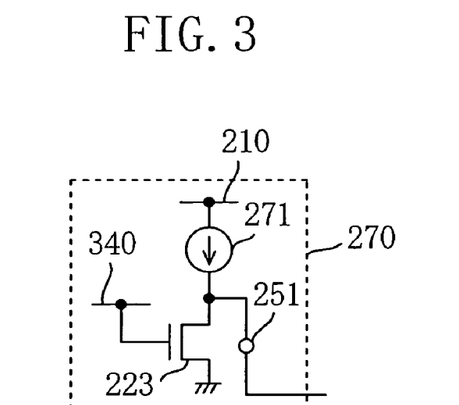
FIG. 3 is a circuit diagram showing a structure of a laser driving circuit according to another alternative example of embodiment 1 of the present invention.

A source-grounded amplifier 270 shown in FIG. 3 may be provided in place of the source-grounded amplifier 260 described above.

Specifically, the source-grounded amplifier 270 is different from the source-grounded amplifier 260 in that a constant-current source 271 is used in place of the N-channel transistor 261.

In general, the threshold voltage of a transistor varies due to production variations, the voltages applied to terminals, the temperature dependency, or the like. In the case where the gate terminal is connected to the first power supply 210 as in the N-channel transistor 261 of the above-described alternative example of embodiment 1, a variation in the threshold voltage of the N-channel transistor 261 becomes relatively large when the voltage of the first power supply 210 rises. Accordingly, the threshold voltage of the N-channel transistor 223 varies, and as a result, a variation in the voltage input to the source-grounded amplifier 260 (the voltage of the second power supply 340 which is input to the gate terminal of the N-channel transistor 223) becomes large when the output of the AND circuit 221 falls to the L level. In order to suppress such a variation to a small variation, the N-channel transistor 261 may be designed to have a large size, for example. However, by simply using the constant-current source 271, the output of the AND circuit 221 readily falls to the L level with a constant input voltage while the circuit area is suppressed to be small.

(Embodiment 2)

Figure 4:
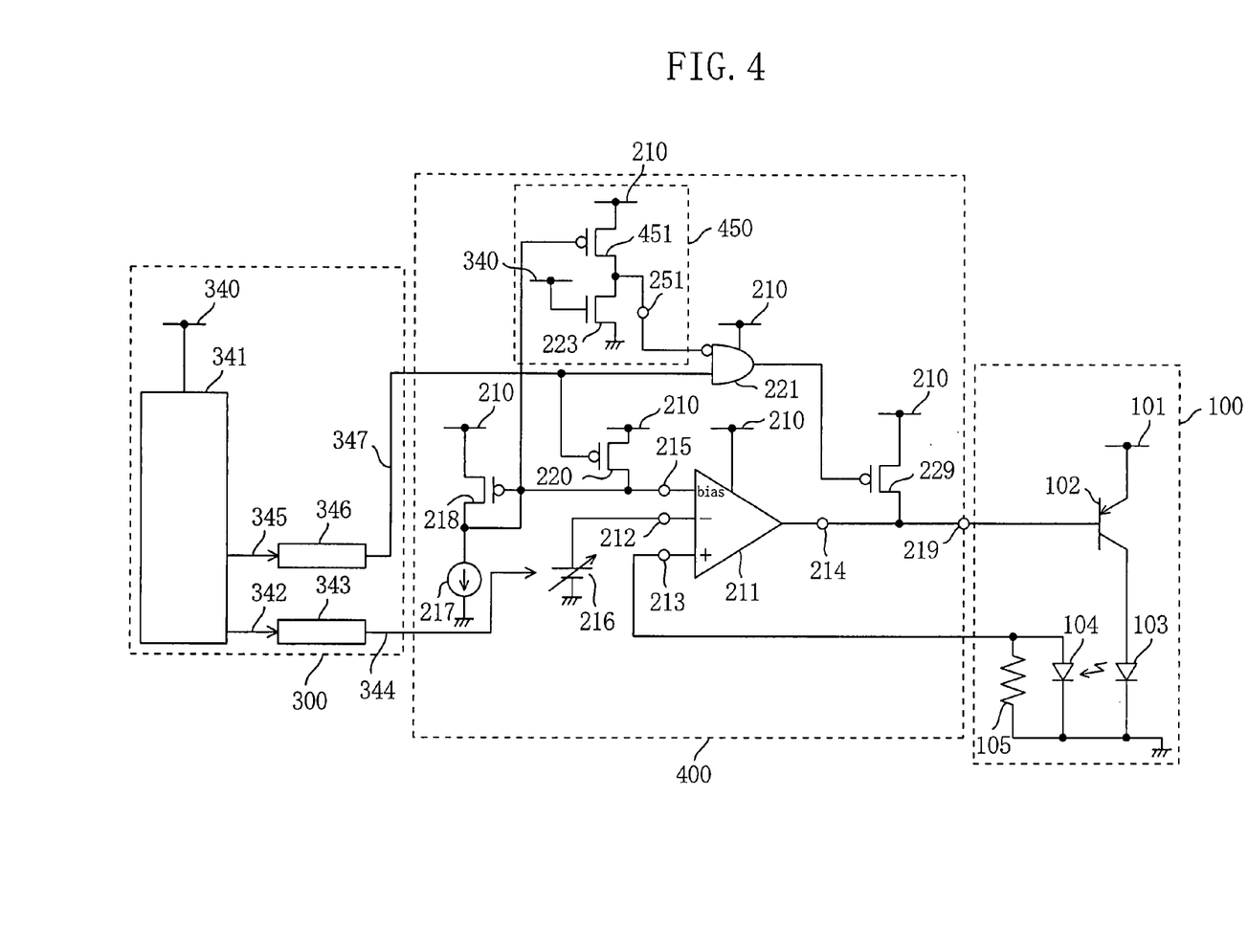
FIG. 4 is a circuit diagram showing a structure of a laser driving circuit according to embodiment 2 of the present invention.

FIG. 4 is a circuit diagram showing a structure of a laser driving circuit according to embodiment 2 of the present invention. In this laser driving circuit, a P-channel transistor 451 is used as the constant-current source 271 in the above-described second alternative example of embodiment 1. Specifically, the gate terminal of the P-channel transistor 451 is connected to the constant-current source 217 and the gate and drain terminals of the transistor 218 to form a current mirror circuit where an electric current which is proportional to the constant-current source 217 flows.

In embodiment 1, the bias input terminal 215 of the differential amplifier 211 is pulled up by the output of the AND circuit 221 till the voltage of the second power supply 340 rises, whereby the output of the differential amplifier 211 is suppressed. In embodiment 2, a transistor 229 is provided for pulling up the output terminal 214 of the differential amplifier 211 (i.e., the output terminal 219 of a laser driving circuit block 400) such that the semiconductor laser driving transistor 102 is OFF irrespective of the output of the differential amplifier 211.

Even with the above structure, the output of the AND circuit 221 is kept at the L level with high accuracy till the voltage of the second power supply 340 rises because the P-channel transistor 451 functions as a constant current circuit. Further, the output terminal 219 is pulled up by the output of the AND circuit 221, whereby the semiconductor laser driving transistor 102 is surely turned OFF, and an excessive electric current flow in the semiconductor laser 103 is prevented.

As described above, part of the current mirror circuit which is used for controlling the bias current of the differential amplifier 211 is commonly used, whereby the constant current circuit is realized only by providing the P-channel transistor 451. Thus, the circuit scale is suppressed to a small scale.

In the case where the control signal 347 is input to the AND circuit 221 and the output terminal 219 is pulled up even when the emission of the semiconductor laser 103 is stopped by the control signal 347 as in embodiment 1, the voltage at the bias input terminal 215 of the differential amplifier 211 may not be controlled by the control signal 347.

(Embodiment 3)

Figure 5:
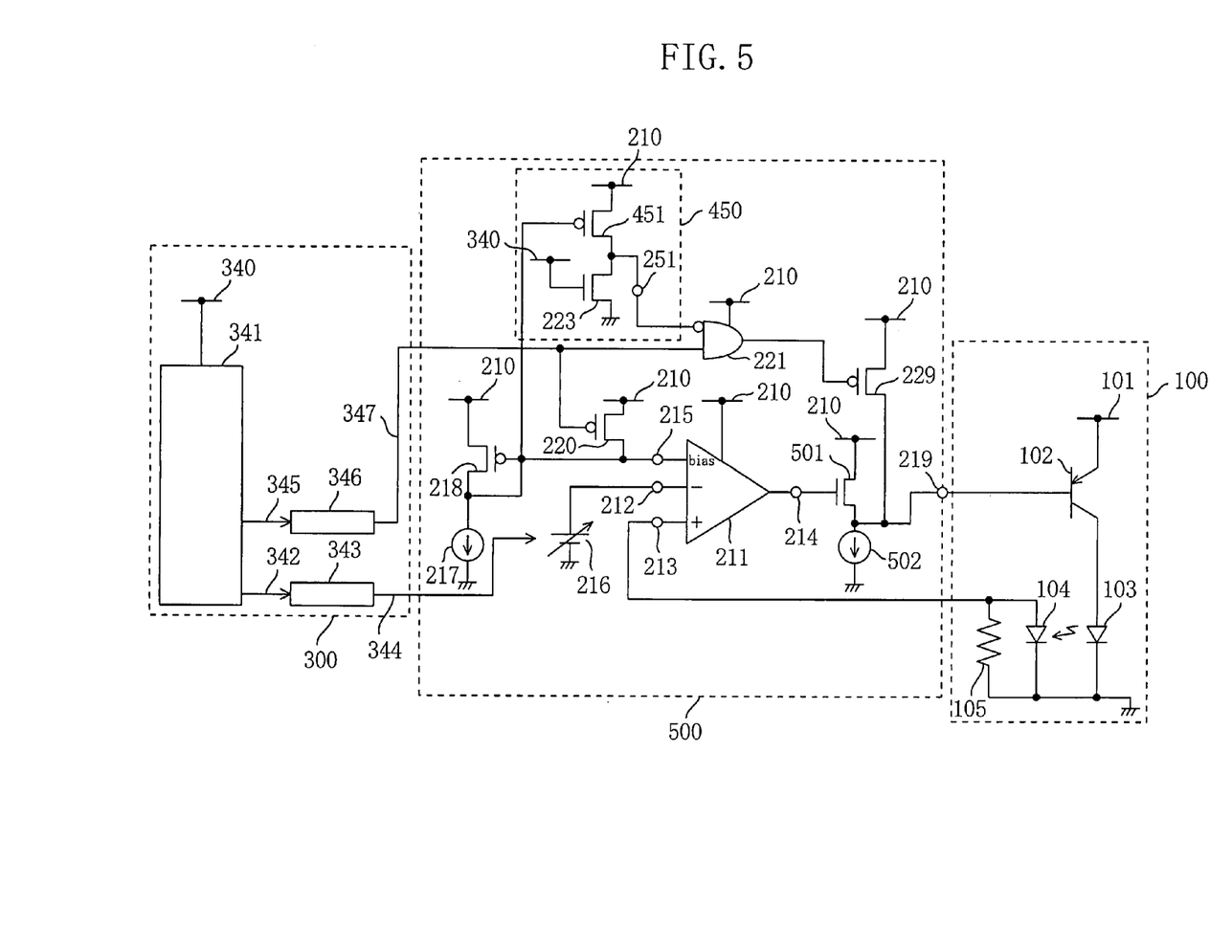
FIG. 5 is a circuit diagram showing a structure of a laser driving circuit according to embodiment 3 of the present invention.

FIG. 5 is a circuit diagram showing a structure of a laser driving circuit according to embodiment 3 of the present invention. This laser driving circuit is different from the laser driving circuit of embodiment 2 in that the output of the differential amplifier 211 is output through a transistor 501 which amplifies the output of the differential amplifier 211 instead of being directly output to the output terminal 219. A constant-current source 502 is connected to the transistor 501 for generating an output bias current. Due to generation of the output bias current, an excessive electric current flow in the transistor 229 is prevented when the transistor 229 is ON till the voltage of the second power supply 340 rises. Thus, breakage of the transistor 229, disconnection of wires, etc., are surely prevented.

It should be noted that the above-described transistor 501 and constant-current source 502 may be provided as the output stage of the differential amplifier.

(Embodiment 4)

Figure 6:
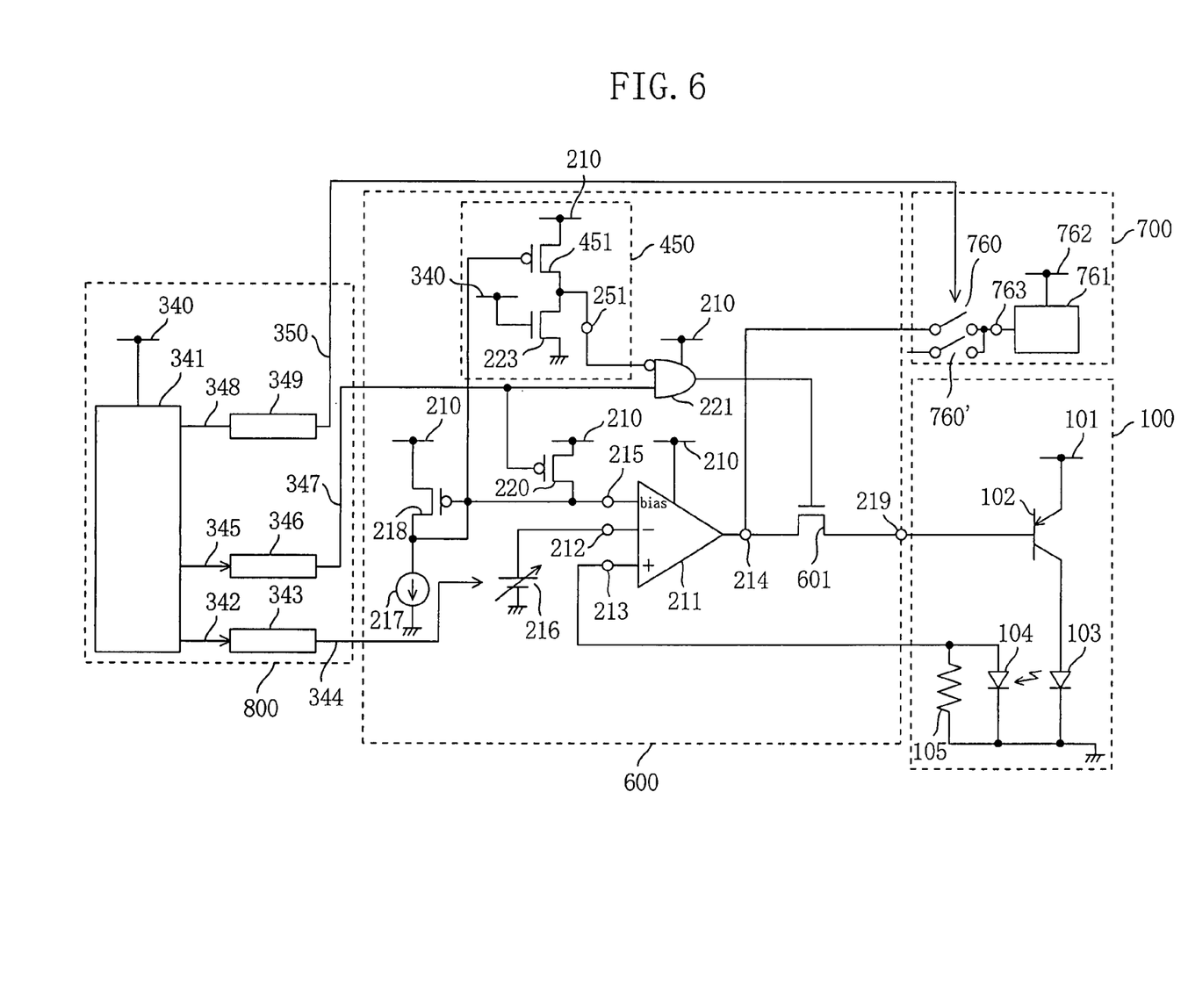
FIG. 6 is a circuit diagram showing a structure of a laser driving circuit according to embodiment 4 of the present invention.

A transistor 601 may be provided for connecting/disconnecting a line between the output terminal 214 and the output terminal 219 as shown in FIG. 6 instead of providing the transistor 229 for pulling up the outputs of the laser driving circuit blocks 400 and 500 as in embodiments 2 and 3. With this structure, the semiconductor laser driving transistor 102 is prevented from being turned ON by the voltage or current input from a semiconductor integrated circuit block 700.

An example of the semiconductor integrated circuit block 700 is now described in brief. The semiconductor integrated circuit block 700 is provided for, for example, monitoring the output voltage of the differential amplifier 211 to correct an influence of the input offset voltage between the inverted input terminal 212 and the non-inverted input terminal 213 of the differential amplifier 211. Specifically, the semiconductor integrated circuit block 700 includes an AD converter 761 which is supplied with the power supply voltage from a power supply 762. Analog switches 760 and 760', which are selectively turned ON, are connected to an input terminal 763 of the AD converter 761. The analog switch 760 is connected to the output terminal 214 of the differential amplifier 211. The analog switch 760 is controlled by a control signal 350 which is generated by converting the voltage level of a control signal 348 output from the control circuit 341 of a control circuit block 800 by a level shift circuit 349. The output signal of the AD converter 761 is fed back to the control circuit block 800 through an unshown signal line for controlling the output voltage of the variable reference power supply 216 such that the influence of the input offset voltage is compensated for. The analog switch 760' receives the voltage output from an unshown different circuit, and the AD converter 761 is commonly employed.

With the above-described semiconductor integrated circuit block 700, the state of the analog switch 760 is unstable when the voltage of the second power supply 340 for the control circuit block 800 does not reach a sufficient level. Therefore, there is a possibility that the analog switches 760 and 760' are simultaneously turned ON. In such a case, the voltage output from the unshown different circuit is applied to the output terminal 214 of the differential amplifier 211 through the analog switches 760' and 760. Nevertheless, the voltage output from the unshown different circuit does not cause the semiconductor laser driving transistor 102 to malfunction because the transistor 601 is OFF before the voltage of the second power supply 340 rises to a sufficient level.

In the examples described in the above embodiments, the present invention is applied to the read-only optical pickup 100. However, the present invention is not limited to such examples but may be applied to a laser driving circuit including a modulation circuit which allows an optical pickup to write information.

In the example described in embodiment 2, the output terminal 219 is pulled up till the voltage of the second power supply 340 rises. In the case where an NPN transistor is used as the semiconductor laser driving transistor 102, it is only necessary to pull down the first power supply 210 to a ground voltage. In order to pull down the first power supply 210 to a ground voltage in embodiment 3, it is only necessary to provide a constant-current source in place of the transistor 501 and a P-channel transistor which is controlled by the differential amplifier 211 in place of the constant-current source 502. In such a case, it is possible that a P-channel transistor is provided as the constant-current source, and part of the current mirror circuit which is used for controlling the bias current of the differential amplifier 211 is commonly used as in the P-channel transistor 451 of a source-grounded amplifier 450, so that the circuit scale is suppressed to a small scale.

The elements described in the above embodiments and alternative examples may be assembled into various combinations within the theoretically possible range. Specifically, the structure described in embodiment 1 and the alternative examples thereof where the resistor 253 or the N-channel transistor 261 is provided between the drain of the output terminal 251 of the source-grounded amplifier 250 or 260 and the first power supply 210 may be applied to the structures of embodiments 2–4. Further, the structure described in embodiment 1 where the voltage at the bias input terminal 215 of the differential amplifier 211 is controlled by the output of the AND circuit 221 may be applied to embodiments 2–4.

As described above, the present invention possesses the effect of providing a laser driving circuit having a small circuit scale which is realized in the form of a MOS device capable of low voltage operation and in which unnecessary writing in an optical disc, or the like, is entirely prevented. The laser driving circuit of the present invention is useful as a driver circuit for driving a semiconductor laser used in an optical disc drive, or the like.

What is claimed is:

1. A laser driving circuit for driving a semiconductor laser, comprising:
   a driving signal output circuit for outputting a driving signal according to a control signal output from a control circuit, the driving signal output circuit being supplied with a voltage of a first power supply, the control circuit being supplied with a voltage of a second power supply, the control signal being used for driving the semiconductor laser;
   a source-grounded amplifier which is supplied with the voltage of the first power supply, the voltage of the second power supply being input to the source-grounded amplifier as an input signal; and
   drive suppression means for stopping the driving signal output circuit from driving the semiconductor laser according to an output of the source-grounded amplifier if the voltage of the second power supply is lower than a predetermined voltage.

2. The laser driving circuit according to claim 1, wherein the source-grounded amplifier includes:
   a transistor having a grounded source terminal and a gate terminal to which the voltage of the second power supply is input; and
   a resistor provided between a drain terminal of the transistor and the first power supply.

3. The laser driving circuit according to claim 1, wherein the source-grounded amplifier includes:
- a first transistor having a grounded source terminal and a gate terminal to which the voltage of the second power supply is input; and
- a second transistor having a source terminal which is connected to a drain terminal of the first transistor and drain and gate terminals which are connected to the first power supply.

4. The laser driving circuit according to claim 1, wherein the source-grounded amplifier includes:
- a transistor having a grounded source terminal and a gate terminal to which the voltage of the second power supply is input; and
- a constant-current circuit provided between a drain terminal of the transistor and the first power supply.

5. The laser driving circuit according to claim 4, further comprising a current mirror circuit for generating a predetermined constant current,
- wherein the constant-current circuit is a transistor having a gate terminal to which a control voltage of the current mirror circuit is input.

6. The laser driving circuit according to claim 1, wherein:
- the driving signal output circuit includes an amplifier whose operation is activated/deactivated by an operation control signal; and
- if the voltage of the second power supply is lower than the predetermined voltage, the drive suppression means outputs the operation control signal such that the operation of the amplifier is stopped.

7. The laser driving circuit according to claim 1, wherein the drive suppression means includes a transistor which sets the driving signal to a predetermined drive stop voltage if the voltage of the second power supply is lower than the predetermined voltage.

8. The laser driving circuit according to claim 7, wherein the predetermined drive stop voltage is the voltage of the first power supply or a ground voltage.

9. The laser driving circuit according to claim 7, wherein the driving signal output circuit includes:
- an amplifier;
- a constant-current circuit; and
- a transistor which is supplied with a bias current from the constant-current circuit and amplifies an output signal of the amplifier to output the driving signal.

10. The laser driving circuit according to claim 1, wherein the drive suppression means includes a transistor which interrupts the driving signal if the voltage of the second power supply is lower than the predetermined voltage.

11. The laser driving circuit according to any one of claims 6 to 10, wherein if the voltage of the second power supply is lower than the predetermined voltage or if the control circuit outputs a drive stop signal, the drive suppression means stops the driving signal output circuit from driving the semiconductor laser.

12. The laser driving circuit according to any one of claims 7 to 10, wherein:
- the driving signal output circuit further includes an amplifier whose operation stops when a drive stop signal is output from the control circuit; and
- if the voltage of the second power supply is lower than the predetermined voltage or if the control circuit outputs the drive stop signal, the drive suppression means stops the driving signal output circuit from driving the semiconductor laser.

* * * * *